US008193825B2

(12) United States Patent
Guo et al.

(10) Patent No.: US 8,193,825 B2
(45) Date of Patent: Jun. 5, 2012

(54) TEST CIRCUIT AND METHOD FOR AN ELECTRONIC DEVICE

(75) Inventors: Wei Guo, Shenzhen (CN); Sha Feng, Shenzhen (CN)

(73) Assignee: Chimei Innolux Corporation, Miaoli County (TW)

( * ) Notice: Subject to any disclaimer, the term of this patent is extended or adjusted under 35 U.S.C. 154(b) by 444 days.

(21) Appl. No.: 12/455,075

(22) Filed: May 28, 2009

(65) Prior Publication Data

US 2009/0295424 A1 Dec. 3, 2009

(30) Foreign Application Priority Data

May 30, 2008 (TW) .............................. 97120033 A

(51) Int. Cl.
*G01R 31/26* (2006.01)
*G01R 31/02* (2006.01)

(52) U.S. Cl. .......... 324/760.01; 324/760.02; 324/762.01

(58) Field of Classification Search . 324/760.01–762.02, 762.05, 762.08–762.09
See application file for complete search history.

(56) References Cited

U.S. PATENT DOCUMENTS

| | | | | |
|---|---|---|---|---|
| 5,801,545 | A * | 9/1998 | Takekoshi et al. | 324/750.25 |
| 6,108,455 | A | 8/2000 | Mancuso | |
| 6,486,927 | B1 | 11/2002 | Kim | |
| 6,794,892 | B2 * | 9/2004 | Matsueda | 324/760.01 |
| 6,809,838 | B1 * | 10/2004 | Gilman et al. | 358/1.9 |
| 6,842,026 | B2 * | 1/2005 | Yamaoka et al. | 324/756.07 |
| 7,911,217 | B2 * | 3/2011 | Nam | 324/760.01 |
| 8,120,597 | B2 * | 2/2012 | Guttag | 345/204 |
| 2011/0109322 | A1 * | 5/2011 | Shi et al. | 324/555 |

* cited by examiner

*Primary Examiner* — Joshua Benitez
(74) *Attorney, Agent, or Firm* — Bacon & Thomas, PLLC

(57) ABSTRACT

A test circuit for an electronic device including a liquid crystal display (LCD) device. The LCD device includes a pulse width modulator (PWM) to provide voltages to a display panel of the LCD device, a plurality of feedback circuits to output feedback voltages to the PWM, and a power supply to provide an operating voltage for the PWM. When the electronic device is in a test mode, the feedback circuits respectively decrease the feedback voltages, such that the PWM increases the voltages output to the display panel according to the feedback voltages, the increased voltages reach predetermined test voltages and test the electronic device.

14 Claims, 4 Drawing Sheets

TEST CIRCUIT AND METHOD FOR AN ELECTRONIC DEVICE

BACKGROUND

1. Technical Field

The present disclosure relates to testing of an electronic device, and particularly to a high voltage test circuit and method for an electronic device.

2. Description of Related Art

Typical LCD devices have the advantages of portability, low power consumption, and low radiation, and are widely used in various portable information products such as notebooks, personal digital assistants (PDAs), video cameras and the like. High voltage testing is one attribute test for an LCD device.

FIG. 4 is a circuit diagram of a commonly used high voltage test circuit 10 for an LCD device. The high voltage test circuit 10 includes a power supply 110, a plurality of LCD devices 130, and a plurality of corresponding test voltage generators 120. The power supply 110 provides an operating voltage to each test voltage generator 120. The test voltage generators 120 provide high test voltages for the LCD devices 130.

FIG. 5 is a circuit diagram of the LCD device 130 and the test voltage generator 120. The LCD device 130 includes a display panel 131 and a circuit board 132 to drive the display panel 131. The circuit board 132 includes a connector 133. The connector 133 includes a plurality of input terminals 134. The test voltage generator 120 includes a plurality of output terminals 121 connected to the input terminals 134.

When the LCD devices 130 are in a test mode, the power supply 110 provides an operating voltage to the test voltage generators 120, which, in turn, output a plurality of high test voltages to the circuit boards 132 of the LCD devices 130 via the connectors 133, and the display panels 131 display test images accordingly.

However, when the LCD devices 130 are in test mode, a test voltage generator 120 is required, increasing the cost of the high voltage test circuit 10.

What is needed, therefore, is a test circuit and method for an LCD device which can overcome the described limitations.

DETAILED DESCRIPTION

Reference will now be made to the drawings to describe preferred and exemplary embodiments of the invention in detail.

Figure 1:
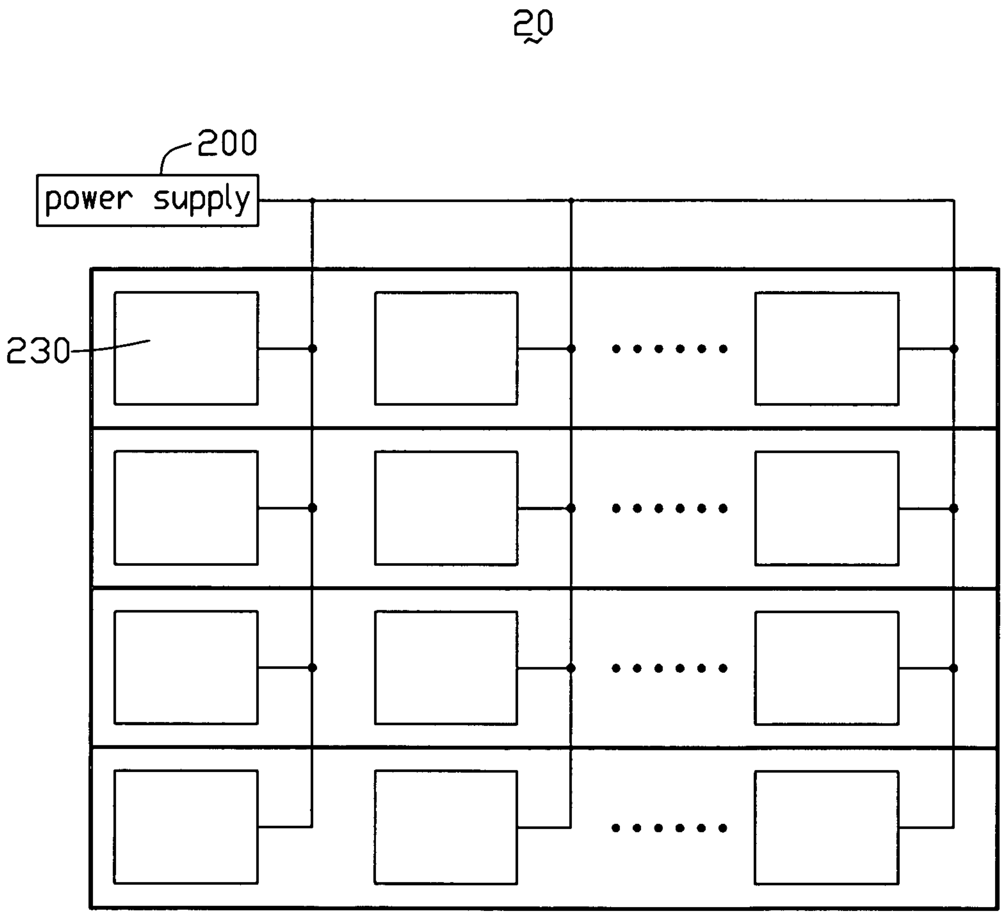
FIG. 1 is a circuit diagram of a first embodiment of a test circuit for an LCD device according to the disclosure.

FIG. 1 is a circuit diagram of a first embodiment of a test circuit 20 for an LCD device according to the disclosure. The test circuit 20 includes a power supply 200 and a plurality of LCD devices 230. The power supply 200 provides a direct current (DC) voltage for the LCD devices 230. In one embodiment, the DC voltage for the LCD devices 230 may be 5V.

Figure 2:
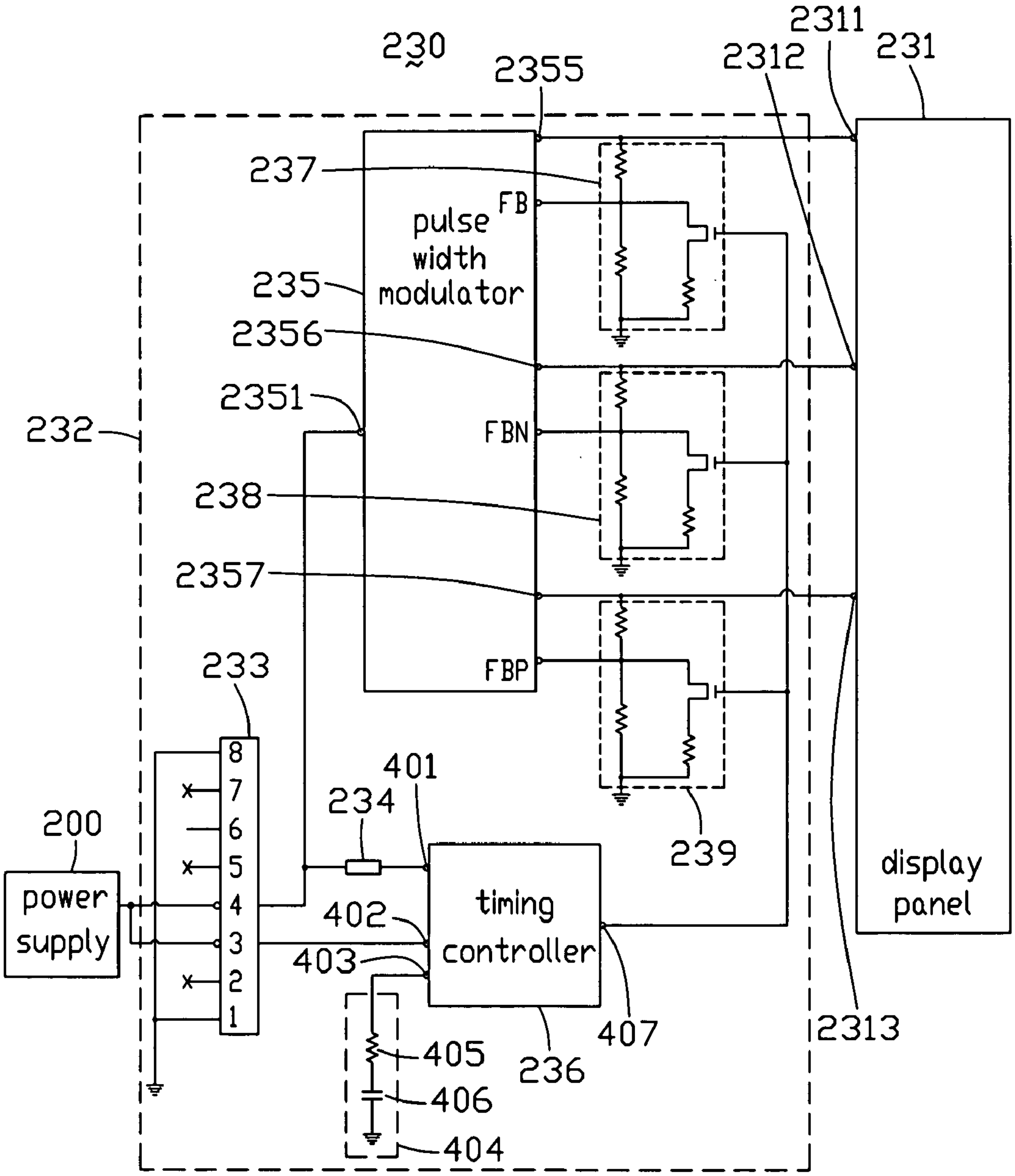
FIG. 2 is a circuit diagram of the LCD device of FIG. 1.

FIG. 2 is a circuit diagram of the LCD device 230. The LCD device 230 includes a display panel 231 and a circuit board 232 to drive the display panel 131. The display panel 231 includes a first voltage input terminal 2311, a second voltage input terminal 2312, and a third voltage input terminal 2313. The circuit board 232 includes a connector 233, a DC voltage converter 234 to convert the 5V DC voltage to a 3.3V DC voltage, in one example, a pulse width modulator (PWM) 235, a timing controller 236, a first feedback circuit 237, a second feedback circuit 238, and a third feedback circuit 239. The power supply 200 provides the 5V DC voltage to the PWM 235 via the connector 233, and provides the 3.3V DC voltage to the timing controller 236 via the connector 233 and the DC voltage converter 234.

The timing controller 236 includes a first operating voltage input terminal 401 to receive the 3.3V DC voltage, a trigger end 402, a reset terminal 403, a reset circuit 404, and a control voltage output terminal 407 to output a control voltage to the three feedback circuits 237, 238, and 239. The reset circuit 404 includes a resistor 405 and a capacitor 406. The reset terminal 403 is grounded via the resistor 405 and the capacitor 406.

The PWM 235 includes a second operating voltage input terminal 2351 to receive the 5V DC voltage, a first feedback terminal FB, a second feedback terminal FBN, a third feedback terminal FBP, a first output terminal 2355 connected to the first voltage input terminal 2311 of the display panel 231, a second output terminal 2356 connected to the second voltage input terminal 2312 of the display panel 231, and a third output terminal 2357 connected to the third voltage input terminal 2313 of the display panel 231. The first feedback circuit 237 includes a first resistor (not labeled), a second resistor (not labeled), a third resistor (not labeled), and a first switch (not labeled). A control terminal (not labeled) of the first switch is connected to the control voltage output terminal 407 of the timing controller 236. A first conduction terminal (not labeled) of the first switch is grounded via the third resistor. A second conduction terminal (not labeled) of the first switch is connected to the first feedback terminal FB of the PWM 235, grounded via the second resistor, and connected to the first output terminal 2355 of the PWM 235 via the first resistor.

The second feedback circuit 238 includes a fourth resistor (not labeled), a fifth resistor (not labeled), a sixth resistor (not labeled), and a second switch (not labeled). A control terminal (not labeled) of the second switch is connected to the control voltage output terminal 407 of the timing controller 236. A first conduction terminal (not labeled) of the second switch is grounded via the sixth resistor. A second conduction terminal (not labeled) of the second switch is connected to the second feedback terminal FBN of the PWM 235, grounded via the fifth resistor, and connected to the second output terminal 2356 of the PWM 235 via the fourth resistor.

The third feedback circuit 239 includes a seventh resistor (not labeled), an eighth resistor (not labeled), a ninth resistor (not labeled), and a third switch (not labeled). A control terminal (not labeled) of the third switch is connected to the control voltage output terminal 407 of the timing controller 236. A first conduction terminal (not labeled) of the second switch is grounded via the ninth resistor. A second conduction terminal (not labeled) of the second switch is connected to the third feedback terminal FBP of the PWM 235, grounded via the eighth resistor, and connected to the third output terminal 2357 of the PWM 235 via the seventh resistor.

A test method for the LCD device 230 is as follows. When the LCD device 230 is in a test mode, the power supply 200 provides the 5V DC voltage to the second operating voltage input terminal 2351 of the PWM 235 via the connector 233, and provides the 3.3V DC voltage to the first operating voltage input terminal 401 of the timing controller 236 via the connector 233 and the DC voltage converter 234. Thus, the PWM 235 and the timing controller 236 start working. At the same time, the power supply 200 provides the 5V DC voltage to the trigger end 402 of the timing controller 236. The control voltage output terminal 407 of the timing controller 236 outputs a control voltage to the three control terminals of the three switches according to the trigger end 402. The switches are switched on. Thus, the second resistor is connected in parallel with the third resistor. The fifth resistor is connected in parallel with the sixth resistor. The eighth resistor is connected in parallel with the ninth resistor. Therefore, resistance between the first feedback terminal FB and ground decreases, resistance between the second feedback terminal FBN and ground decreases, and resistance between the third feedback terminal FBP and ground decreases. Correspondingly, voltages of the three feedback terminals 2352, 2353, 2354 of the PWM 235 decrease respectively. Voltages of the three output terminals 2355, 2356, 2357 increase respectively, and are provided to the display panel 231. Voltages of three output terminals 2355, 2356, 2357 can reach predetermined test voltages through appropriate selection of the resistances of the third resistor, the sixth resistor and the ninth resistor, so the display panel 231 is tested and displays a test image. The predetermined test voltages are higher than the normal voltages. For example, the normal voltages of the three output terminals 2355, 2356, 2357 may be 12.75V, 26V, −6V, in one exemplary embodiment. The predetermined test voltages of the three output terminals 2355, 2356, 2357 may be 13.5V, 30V, −8V, in one exemplary embodiment.

In addition, the reset terminal 403 of the timing controller 236 is regarded as a current supply, and charges the reset circuit 404. When a voltage of the reset terminal 403 reaches a predetermined voltage, the control voltage output terminal 407 of the timing controller 236 stops the control voltage according to the reset terminal 403. Thus, the three switches are switched off. Three output terminals 2355, 2356, 2357 of the PWM 231 output normal voltages to the display panel 231. The display panel 231 displays a normal image.

When the LCD device 230 is in an operating mode, the trigger end 402 of the timing controller 236 does not receive the 5V DC voltage from the power supply 200. Therefore, the control voltage output terminal 407 of the timing controller 236 does not output the control voltage to the three control terminals of the three switches according to the trigger end 402. The three switches keep switched off states. Three output terminals 2355, 2356, 2357 of the PWM 231 output normal voltages to the display panel 231. The display panel 231 displays a normal image.

Because the test voltages of the test circuit 20 are generated by the circuit board 232 of the LCD device 230, the test circuit 20 does not require a test voltage generator. Accordingly, a cost of the test circuit 20 of the LCD device 230 is relatively low.

Figure 3:
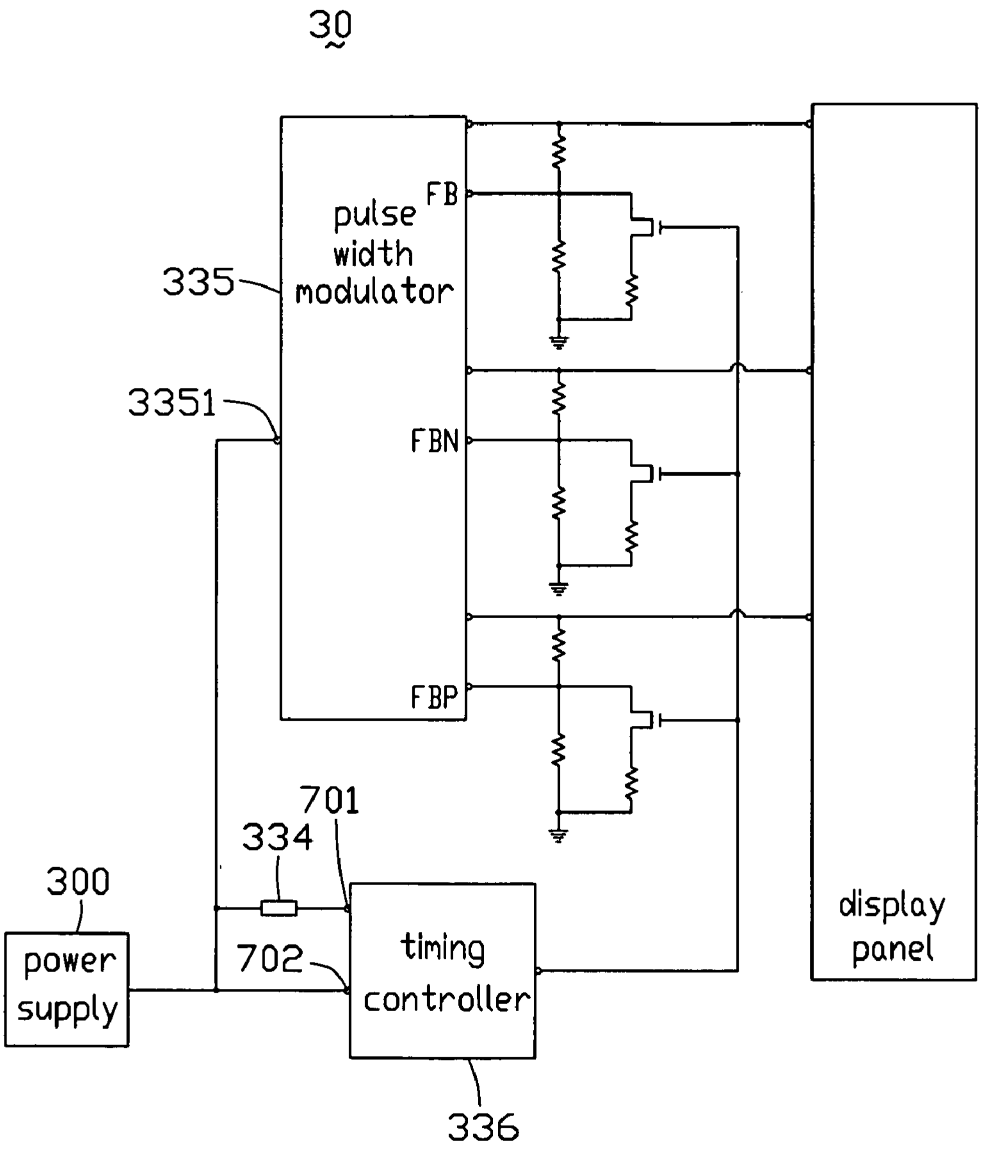
FIG. 3 is a circuit diagram of a second embodiment of a test circuit for an LCD according to the disclosure.
Figure 4:
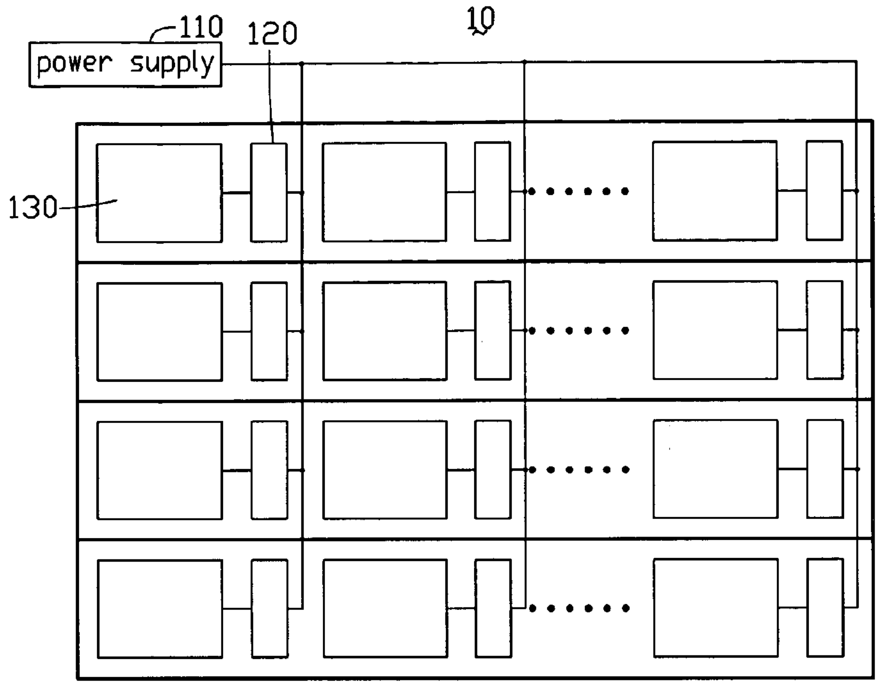
FIG. 4 (RELATED ART)
FIG. 4 is a circuit diagram of a commonly used high voltage test circuit for an LCD device.
Figure 5:
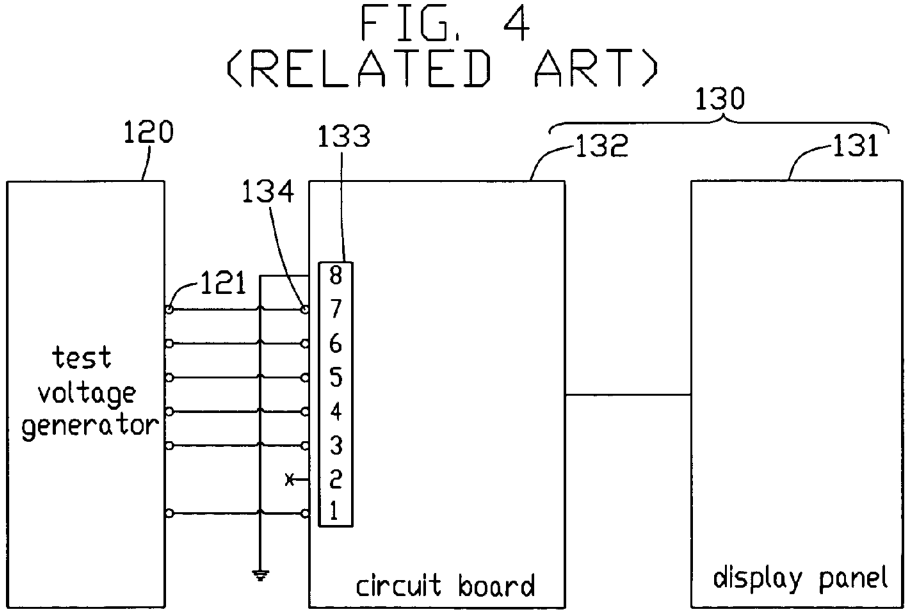
FIG. 5 (RELATED ART)
FIG. 5 is a circuit diagram of the LCD device and test voltage generator of FIG. 4.

FIG. 3 is a circuit diagram of a second embodiment of a test circuit for an LCD according to the disclosure, differing from test circuit 20 of the LCD device 230 of the previous embodiment in that a connector, a reset terminal and a rest circuit are omitted. A power supply 300 of the test circuit provides a 3.3V DC voltage to a first operating voltage input terminal 701 of a timing controller 336 only via a DC voltage converter 334, and directly provides a 5V DC voltage to a second operating voltage input terminal 3351 of a PWM 335 and a trigger end 702 of the timing controller 336. The test circuit 30 uses a software application to control a time of the test.

It is to be further understood that even though numerous characteristics and advantages of preferred and exemplary embodiments have been set out in the foregoing description, together with details of structures and functions associated with the embodiments, the disclosure is illustrative only, and changes may be made in detail (including in matters of arrangement of parts) within the principles of the disclosure to the full extent indicated by the broad general meaning of the terms in which the appended claims are expressed.

What is claimed is:

1. A test circuit for an electronic device comprising a liquid crystal display (LCD), the test circuit comprising:

a pulse width modulator (PWM) to provide voltages to a display panel of the LCD;

a plurality of feedback circuits to output feedback voltages to the PWM;

a power supply to provide an operating voltage for the PWM; and a controller to output a control voltage to the feedback circuits in response to the electronic device being in a test mode, the controller comprising a trigger end;

wherein, when the electronic device is in the test mode, the power supply provides the operating voltage to the controller and the controller outputs the control voltage accordingly, and the plurality of feedback circuits respectively decrease the feedback voltages according to the control voltage, such that the PWM increases the voltages output to the display panel according to the feedback voltages, and the increased voltages reach predetermined test voltages to test the electronic device; and when the electronic device is in an operating mode, the trigger end of the controller does not receive the operating voltage from the power supply, and the controller does not output the control voltage according to the trigger end.

2. The test circuit for the electronic device of claim 1, wherein the feedback circuits comprise a first feedback circuit, the PWM comprises a first feedback terminal connected to the first feedback circuit, and wherein when the first feedback circuit receives the control voltage, the first feedback circuit decreases a resistance between the first feedback terminal and ground, and the voltage of the first feedback terminal decreases.

3. The test circuit for the electronic device of claim 2, wherein the first feedback circuit comprises a first voltage divider to feed a voltage back to the first feedback terminal of the PWM and a first resistor, and wherein when the first feedback circuit receives the control voltage, the first resistor is connected between the first feedback terminal and the ground.

4. The test circuit for the electronic device of claim 3, wherein the feedback circuits further comprise a second feedback circuit and the PWM further comprises a second feedback terminal connected to the second feedback circuit, and wherein when the second feedback circuit receives the control voltage, the second feedback circuit decreases a resistance between the second feedback terminal and ground, and the voltage of the second feedback terminal decreases.

5. The test circuit for the electronic device of claim 4, wherein the PWM further comprises a second voltage divider to feed a voltage back to the second feedback terminal of the PWM and a second resistor, and wherein when the second feedback circuit receives the control voltage, the second resistor is connected between the second feedback terminal and the ground.

6. The test circuit for the electronic device of claim 5, wherein the feedback circuits further comprise a third feedback circuit, the PWM further comprises a third feedback terminal connected to the third feedback circuit, and wherein when the third feedback circuit receives the control voltage, the third feedback circuit decreases a resistance between the third feedback terminal and ground, and the voltage of the third feedback terminal decreases.

7. The test circuit for the electronic device of claim 6, wherein the PWM further comprises a third voltage divider to feed a voltage back to the third feedback terminal of the PWM and a third resistor, and wherein when the third feedback circuit receives the control voltage, the third resistor is connected between the third feedback terminal and the ground.

8. The test circuit for the electronic device of claim 1, wherein the operating voltage is a 5V direct current (DC) voltage.

9. The test circuit for the electronic device of claim 1, wherein a software application controls a time of the test.

10. A test circuit for an electronic device comprising a liquid crystal display (LCD), the test circuit comprising:

- a pulse width modulator (PWM) to provide voltages to a display panel of the LCD;
- a plurality of feedback circuits to output feedback voltages to the PWM;
- a power supply to provide an operating voltage for the PWM; and
- a controller to output a control voltage to the feedback circuits in response to the electronic device being in a test mode, the controller comprising a trigger end, a reset circuit, and a reset terminal to charge the reset circuit;
- wherein, when the electronic device is in the test mode, the power supply provides the operating voltage to the controller, the controller outputs the control voltage accordingly, and the plurality of feedback circuits respectively decrease the feedback voltages according to the control voltage, such that the PWM increases the voltages output to the display panel according to the feedback voltages, and the increased voltages reach predetermined test voltages to test the electronic device; and
- when a voltage of the reset terminal reaches a predetermined voltage, the controller stops the control voltage according to the reset terminal.

11. The test circuit for the electronic device of claim 10, wherein the reset circuit comprises a resistor and a capacitor and the reset terminal is grounded via the resistor and the capacitor.

12. The test circuit for the electronic device of claim 10, further comprising a direct current (DC) voltage converter connected between the power supply and the controller, wherein the operating voltage is a 5V DC voltage, and the voltage converter converts the 5V DC voltage to a 3.3V DC voltage, the 3.3V DC voltage being another operating voltage for the controller.

13. A test method for an electronic device, the method comprising:

- providing a liquid crystal display (LCD) device, the LCD device comprising a pulse width modulator (PWM) to provide voltages to a display panel of the LCD and a plurality of feedback circuits to output feedback voltages to the PWM;
- providing a power supply to provide an operating voltage to the PWM;
- providing a controller to output a control voltage to the feedback circuits in response to the electronic device being in a test mode, wherein the controller comprises a trigger end; and when the electronic device is in the test mode, the power supply provides the operating voltage to the controller and the controller outputs the control voltage accordingly; and when the electronic device is in an operating mode, the trigger end of the controller does not receive the operating voltage from the power supply, and the controller does not output the control voltage according to the trigger end; and
- decreasing voltages of the feedback voltages using the feedback circuits when the electronic device is in the test mode, and increasing the voltages output to the display panel according to the feedback voltages using the PWM, wherein the increased voltages reach predetermined test voltages to test the electronic device.

14. The test method of claim 13, wherein the operating voltage is a 5V direct current (DC) voltage.

* * * * *